United States Patent [19]

Tomihari

[11] Patent Number: 5,543,680
[45] Date of Patent: Aug. 6, 1996

[54] FIELD EMISSION TYPE CATHODE STRUCTURE FOR CATHODE-RAY TUBE

[75] Inventor: Yoshinori Tomihari, Tokyo, Japan

[73] Assignee: NEC Corporation, Minato-ku, Japan

[21] Appl. No.: 325,170

[22] Filed: Oct. 20, 1994

[30] Foreign Application Priority Data

Oct. 20, 1993 [JP] Japan .................. 5-262452

[51] Int. Cl.$^6$ ................................. H01J 19/24
[52] U.S. Cl. ............................ 313/336; 313/331
[58] Field of Search ........................ 313/336, 331

[56] References Cited

U.S. PATENT DOCUMENTS

| | | | |
|---|---|---|---|
| 5,103,145 | 4/1992 | Doran | 315/381 |
| 5,145,438 | 9/1992 | Bol | 445/49 |
| 5,191,217 | 3/1993 | Kane et al. | 250/423 F |
| 5,219,310 | 6/1993 | Tomo et al. | 445/24 |
| 5,378,963 | 1/1995 | Ikeda | 313/495 |
| 5,430,329 | 7/1995 | Harada et al. | 257/786 |
| 5,430,347 | 7/1995 | Kane et al. | 313/336 X |

FOREIGN PATENT DOCUMENTS 48-90467  11/1973  Japan .................. 313/336

Primary Examiner—Alvin E. Oberley
Assistant Examiner—Lawrence D. Richardson
Attorney, Agent, or Firm—Burns, Doane, Swecker & Mathis, L.L.P.

[57] ABSTRACT

In a field emission type cathode structure for a CRT, a grid electrode has an opening at a position corresponding to a position of a bonding wire for connecting a gate electrode to a lead connected to a power supply for a gate voltage. A bonding tool moves vertically through the opening of the grid electrode to bond the bonding wire on the gate electrode and the lead.

5 Claims, 4 Drawing Sheets

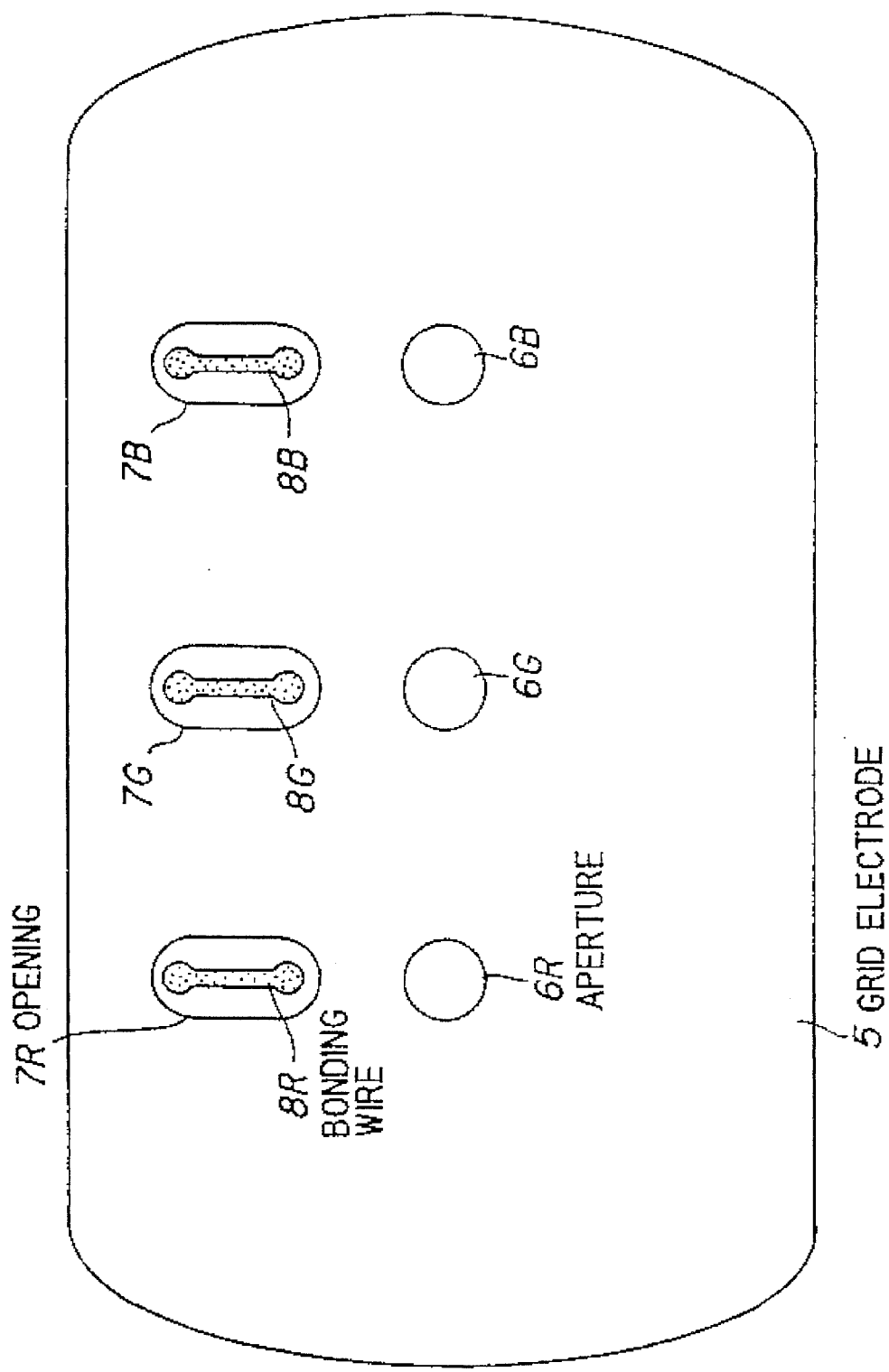

FIELD EMISSION TYPE CATHODE STRUCTURE FOR CATHODE-RAY TUBE

FIELD OF THE INVENTION

The invention relates to a field to a field emission type cathode structure of a cathode-ray tube (CRT), and more particularly to, the improvement on a grid electrode of a field emission type cathode structure of a CRT.

BACKGROUND OF THE INVENTION

A first conventional cathode structure for a color CRT comprises cathodes each comprising an electron emitting layer coated on an outside surface of a closed end of a metal sleeve and a heater for heating the electron emitting layer to a temperature in operation. The cathodes are supported together with a control electrode, a shield electrode, a focusing electrode, and an accelerating electrode by a glass column.

In operation, the electron emitting layers of the cathodes are heated to approximately 800° C. by the heaters, so that electrons are emitted from the electron emitting layers. Beams of the emitted electrons are prevented from the divergence thereof by prefocus lenses defined between the shield electrode and the focusing electrode, and focused on a screen by main lenses defined between the focusing electrode and the accelerating electrode.

In the first conventional cathode structure, however, there are disadvantages in that (1) the time of several seconds takes before an image is displayed on the screen, because the electron emitting layers must be heated to the temperature in operation, (2) heating the electron emitting layers consumes a considerable amount of electric power, and (3) thermal deformation of the electrons must be considered in designing the electrodes, because the electrodes receive heat from the heated cathodes, and the glass column is softened in assembly of the electrodes and the cathodes, and then solidified after assembly thereof.

A second conventional cathode structure for a color CRT which is a field emission type cathode structure is practically used to overcome the disadvantages of the first conventional cathode structure, and comprises cathodes each having a micropoint, a gate electrode having apertures corresponding to the micropoints of the cathodes, and a grid electrode having apertures corresponding to the apertures of the gate electrode. The gate electrode is connected via a bonding wire to a lead connected to a DC power supply.

In operation, a predetermined DC voltage is applied to the gate electrode by the DC power supply, so that an electric field is applied across the micropoints of the cathodes. In this circumstance, when brightness signals of red (R), green (G) and blue (B) are applied to the cathodes, electrons are emitted dependently on the brightness signals from the micropoints of the cathodes to propagate through the apertures of the gate and grid electrodes to the screen.

In the second conventional cathode structure, however, there is disadvantages in that operation of bonding the bonding wire to the gate electrode is difficult to be carried out, because the grid electrode is positioned in the vicinity of the gate electrode by several hundreds to one thousand μm, and a short-circuit tends to occur between the gate and grid electrodes by the bonding wire.

SUMMARY OF THE INVENTION

Accordingly, it is an object of the invention to provide a field emission type cathode structure for a CRT in which the bonding operation for a bonding wire is easily carried out between a gate electrode and a lead connected to a power supply.

It is a further object of the invention to provide a field emission type cathode structure for a CRT in which a short-circuit never occurs between a gate and grid electrodes by a bonding wire.

According to the invention, a field emission type cathode structure for a CRT, comprises:

a substrate being conductive at least on a top plane thereof;

at least one micropoint for emitting electrons, the at least one micropoint being provided on the top plane of the substrate;

a gate electrode for applying an electric field to the at least one micropoint to induce emission of the electrons from the at least one micropoint;

an insulating layer for insulating the grid electrode from the at least one micropoint;

a grid electrode having at least one aperture for flowing a beam of the electrons therethrough, the grid electrode being applied with a grid voltage to control flow of the beam; and a bonding wire for connecting the grid electrode to a lead connected to a power supply for the grid voltage;

wherein the grid electrode has an opening at a position corresponding to a position of the bonding wire.

BRIEF DESCRIPTION OF THE DRAWINGS

The invention will be explained in more detail in conjunction with appended drawings, wherein:

FIG. 4 is a plan view showing the field emission type cathode structure for a CRT in the preferred embodiment as shown in FIG. 3.

DESCRIPTION OF THE PREFERRED EMBODIMENT

Before explaining a field emission type cathode structure for a cathode-ray tube (CRT) in a preferred embodiment according to the invention, the aforementioned first and second conventional cathode structures will be explained in FIGS. 1 and 2.

Figure 1:
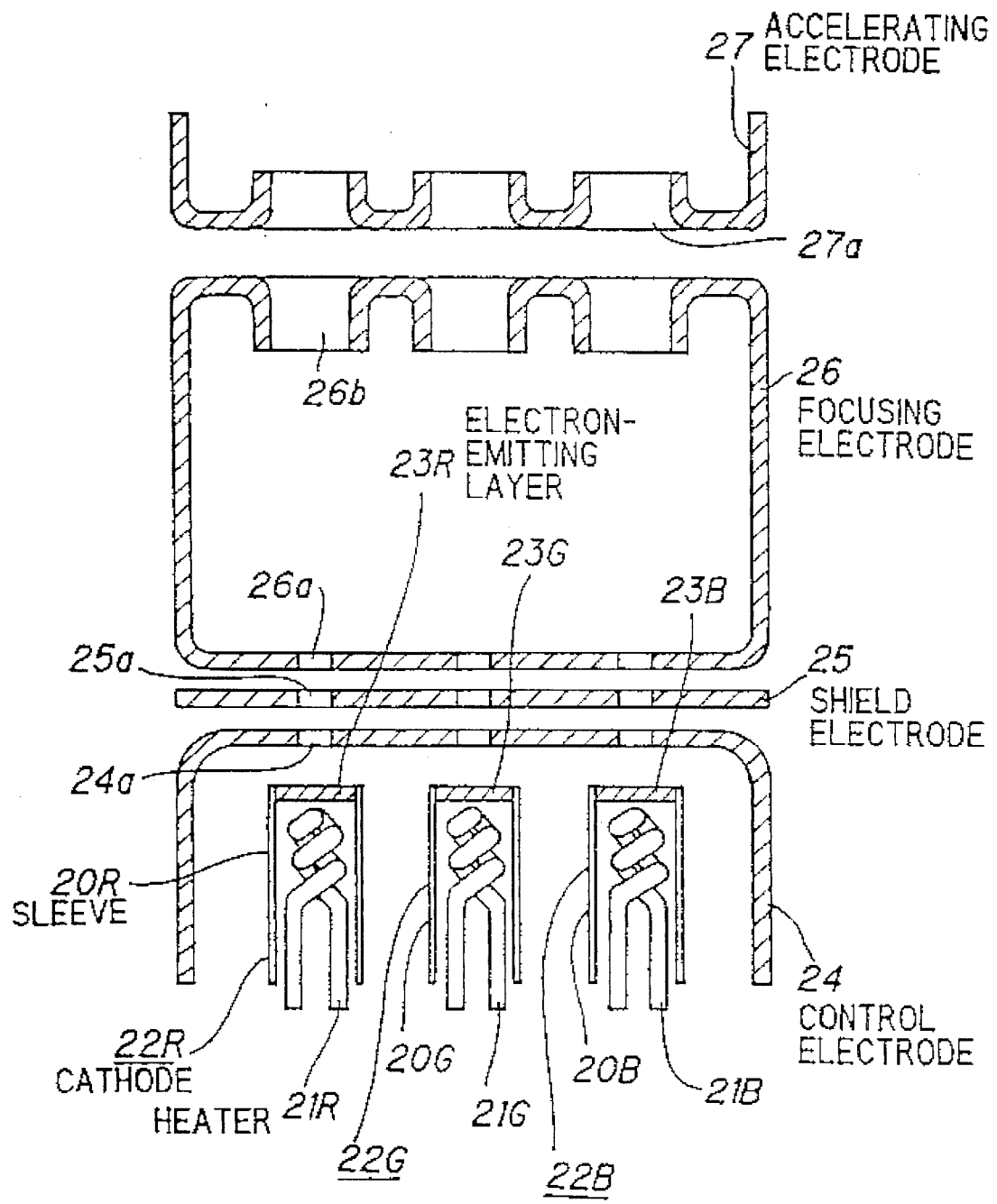
FIG. 1 is a cross-sectional view showing a first conventional cathode structure for a color CRT.

FIG. 1 shows the aforementioned first conventional cathode structure for a color CRT which comprises cathodes 22R, 22G and 22B comprising heaters 21R, 21G and 21B, sleeves 20R, 20G and 20B of, for instance, Ni—Cr having open and closed ends and containing the heaters 21R, 21G and 21B, and electron-emitting layers 23R, 23G and 23B coated on the closed ends of the sleeves 20R, 20G and 20B, a control electrode 24 having apertures 24a, a shield electrode 25 having apertures 25a, a focusing electrode 26 having apertures 26a and 26b, and an accelerating electrode 27 having apertures 27a, wherein the cathodes 22R, 22G and 22B and the respective electrodes 24, 25, 26 and 27 are supported by a glass column (not shown), such that each electrode is held by predetermined intervals, and each aperture is aligned on an axial line.

In operation, the cathodes 22R, 22G and 22B are heated at approximately 800° C. by the heaters 21R, 21G and 21B, so that thermal electrons are emitted from the electron-emitting layers 23R, 23G and 23B. Beams of the emitted electrons are passed through regions defined by the apertures 24a of the control electrode 24, and the divergence of the electron beams is suppressed by prefocus lenses defined between the shield and focusing electrodes 25 and 26. Then, the electron beams are focused on a screen by main lenses defined between the focusing and accelerating electrodes 26 and 27, so that the electron beams focused on the screen collide with fluorescent spots coated on the screen to emit lights. Thus, a color image is displayed on the screen.

In the first conventional cathode structure, the time of several seconds takes before the color image is displayed on the screen, because the cathodes 22R, 22G and 22B are required to be heated to the temperature for electron-emission. Further, a considerable amount of electric power is consumed in the heaters 21R, 21G and 21B. As explained above, the glass column is used to support the cathodes 22R, 22B and 22B, and the electrodes 24 to 27, wherein glass is softened in assembly, and is solidified after assembly, and the electrodes 24 to 27 are subject to radiation heat of the cathodes 22R, 22G and 22B in operation. For these influences, the intervals of each electrode vary to deviate the electrostatic characteristics of the electron beams. Therefore, thermal deformation occurring in operation at a high temperature must be considered in designing a thermal type cathode structure for a color CRT.

Figure 2:
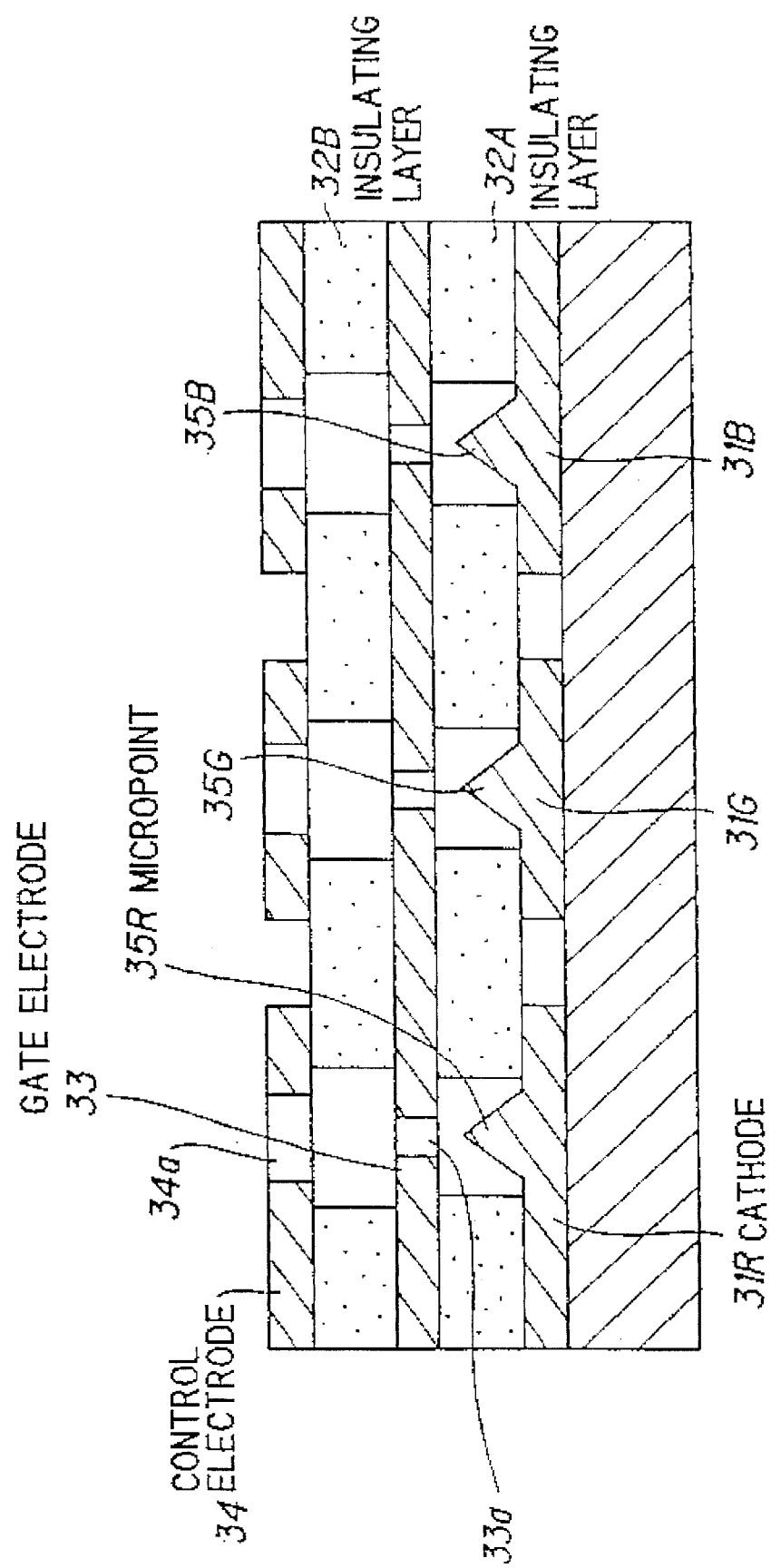
FIG. 2 is a cross-sectional view showing a second conventional cathode structure for a color CRT.

FIG. 2 shows the second conventional cathode structure for a color CRT overcoming the disadvantages of the first conventional cathode structure.

The second conventional cathode structure is described in the Japanese Patent Kokai No. 48-90467 laid open on Nov. 26, 1973, and comprises cathodes 31R, 31G and 31B having micropoints 35R, 35G and 35B insulated by an insulating layer 32A, a gate electrode 33 of a metal thin film having apertures 33a corresponding to the micropoints 35R, 35G and 35B, and a control electrode 34 having apertures 34a corresponding to the apertures 33a and insulated from the gate electrode 33 by an insulating layer 32B.

In operation, brightness signals of red (R), green (G) and blue (B) are applied to the cathodes 31R, 31G and 31B, and a predetermined voltage is applied to the gate electrode 33, so that field emission currents flow through the micropoints 35R, 35G and 35B. Consequently, electrons thus emitted from the micropoints 35R, 35G and 35B are passed through the apertures 34a of the control electrode 34 to be collided with a screen as explained in the first conventional cathode structure.

Next, a field emission type cathode structure for a CRT in the preferred embodiment according to the invention will be explained.

Figure 3:
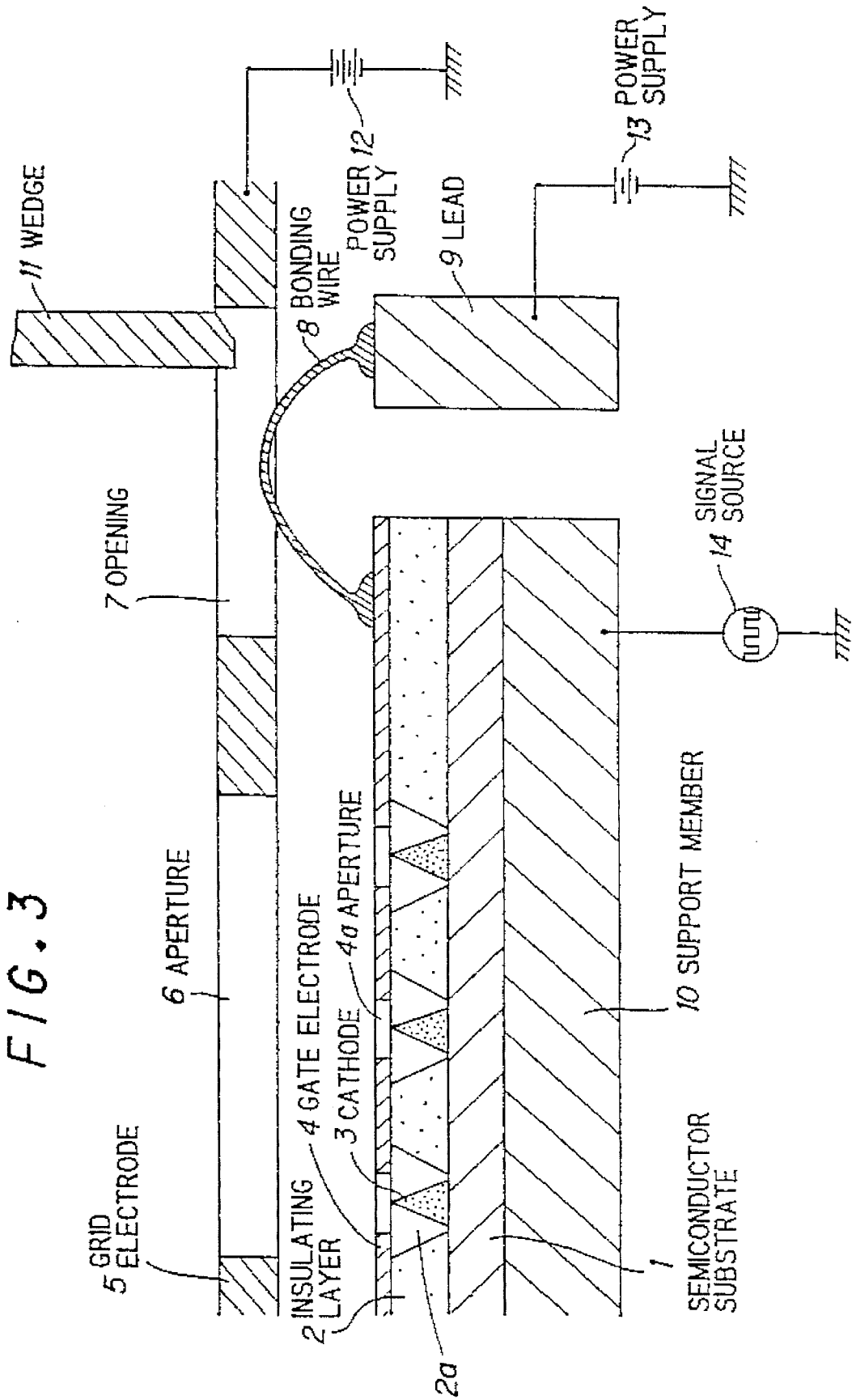
FIG. 3 is a cross-sectional view showing a field emission type cathode structure for a CRT in a preferred embodiment according to the invention.

FIG. 3 shows the field emission type cathode structure which comprises a support member 10 connected to a signal source 14, a silicon semiconductor substrate 1 supported on the support member 10, an $SiO_2$ insulating layer 2 having openings 2a formed on the semiconductor substrate 1 by thermal oxidation process, micropoint cathodes 3 formed in the openings 2a on the semiconductor substrate 1 by the process, for instance, as explained in the U.S. Pat. No. 3,755,704, a gate electrode 4 having apertures 4a corresponding to the micropoint cathodes 3, a bonding wire 8 connecting the gate electrode 4 to a lead 9 connected to a power supply 13, and a grid electrode 5 having an aperture 6 corresponding to the apertures 4a of the gate electrode 4 and an opening 7 for operation of bonding the bonding wire 8 to the gate electrode 4 and the lead 9 by a bonding wedge 11 and connected to a power supply 12.

FIG. 4 shows the top plane of the field emission type cathode structure as explained in FIG. 3, wherein the grid electrode 5 is provided with the apertures 6 (6R for red, 6G for green and 6B for blue) and the elliptic openings 7 (7R for red, 7G for green and 7B for blue), through which the bonding wires 8 (8R for red, 8G for green and 8B for blue) are observed.

In the field emission type cathode structure, each of the micropoint cathodes 3 is formed of a metal such as Mo, Ta, etc. and shaped to have a bottom of a diameter equal to or less than approximately 1 μm and a tip of a diameter of approximately 20 nm, the insulating layer 2 has a thickness of approximately 1 μm, and the gate electrode 4 is formed of Mo, W, etc. having a thickness of approximately 0.4 μm, and each aperture 4a thereof has a diameter equal to or less than approximately 1 μm. The interval between the grid electrode 5 and the gate electrode 4 is one hundred to several hundreds μm.

In operation, the micropoint cathodes 3 are applied with a brightness signal via the support member 10 from the signal source 14, and a threshold voltage of several tens to 200 V is applied across the micropoint cathodes 3 and the gate electrode 4 to generate a strength of an electric field of $10^7$ V/m at most which is required for the emission of electrons from the micropoint cathodes 3 by the power supply 13 connected via the lead 9 and the bonding wire 8 thereto. Consequently, an amount of electrons depending on the brightness signal are emitted from the micropoint cathodes 3, and an electron beam thus obtained is controlled to be passed through the aperture 6 of the grid electrode 5 in accordance with a voltage applied to the grid electrode 5 by the power supply 12. Thus, the electron beam collides with the screen to display an image thereon.

In fabrication of the field emission type cathode structure, the bonding wire 8 is bonded to the gate electrode 4 and the lead 9 by a conventional process using the bonding wedge 11 moving vertically through the opening 7.

The opening 7 is positioned at a distance of three times the diameter of the aperture 4a of the gate electrode 4 from the edge of the aperture 4a to apply no influence on the distribution of the electric field, and has a size which is determined in consideration of the bonding operation and the strength of the grid electrode 5. As a result, the short-circuit between the bonding wire 8 and the grid electrode 5 is avoided.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A field emission type cathode structure for a CRT, comprising:

a substrate being conductive at least on a top plane thereof;

at least one micropoint for emitting electrons, said at least one micropoint being provided on said top plane of said substrate;

a gate electrode for applying an electric field at said at least one micropoint to induce emission of said electrons from said at least one micropoint;

an insulating layer for insulating said gate electrode from said at least one micropoint;

a grid electrode having at least one aperture through which a beam of said electrons flows, said grid electrode being applied with a grid voltage to control flow of said beam; and at least one bonding wire for connecting said gate electrode to a lead connected to a power supply for said gate voltage;

wherein said grid electrode has at least one opening at a position corresponding to a position of said at least one bonding wire.

2. A field emission type cathode structure for a CRT, according to claim 1, wherein:

said at least one opening is elliptic.

3. A field emission type cathode structure for a CRT, comprising:

a substrate being conductive at least on a top plane thereof;

at least one micropoint for emitting electrons, said at least one micropoint being provided on said top plane of said substrate;

a gate electrode for applying an electric field at said at least one micropoint to induce emission of said electrons from said at least one micropoint;

an insulating layer for insulating said gate electrode from said at least one micropoint;

a grid electrode having at least one aperture through which a beam of said electrons flows, said grid electrode being applied with a grid voltage to control flow of said beam; and a bonding wire for connecting said gate electrode to a lead connected to a power supply for said gate voltage;

wherein said grid electrode has an opening at a position corresponding to a position of said bonding wire, and said bonding wire is bonded on said gate electrode and said lead by a bonding tool, said opening of said grid electrode being positioned such that said bonding tool can move vertically through said opening.

4. A field emission type cathode structure for a CRT, comprising:

a substrate being conductive at least on a top plane thereof;

at least one micropoint for emitting electrons, said at least one micropoint being provided on said top plane of said substrate;

a gate electrode for applying an electric field to said at least one micropoint to induce emission of said electrons from said at least one micropoint;

an insulating layer for insulating said grid electrode from said at least one micropoint;

a grid electrode having at least one aperture through which a beam of said electrons flows, said grid electrode being applied with a grid voltage to control flow of said beam; and a bonding wire for connecting said gate electrode to a lead connected to a power supply for said gate voltage;

wherein said grid electrode has an opening at a position corresponding to a position of said bonding wire, and said opening of said grid is separated from said aperture of said grid by a distance which is three times a diameter of said aperture of said grid.

5. A field emission type cathode structure for a CRT, comprising:

a substrate being conductive at least on a top plane thereof;

at least one micropoint for emitting electrons, said at least one micropoint being provided on said top plane of said substrate;

a gate electrode for applying an electric field to said at least one micropoint to induce emission of said electrons from said at least one micropoint;

an insulating layer for insulating said gate electrode from said at least one micropoint;

a grid electrode having at least one aperture through which a beam of said electrons flows, said grid electrode being applied with a grid voltage to control flow of said beam; and a bonding wire for connecting said gate electrode to a lead connected to a power supply for said gate voltage;

wherein said grid electrode has an opening at a position corresponding to a position of said bonding wire, said opening of said grid electrode being positioned such that said bonding tool can move vertically through said opening, and interval between said grid electrode and said gate electrode being one to several hundreds μm.

* * * * *